United States Patent
Dörr et al.

(10) Patent No.: US 6,911,291 B2
(45) Date of Patent: Jun. 28, 2005

(54) RECORDING MATERIAL HAVING A NEGATIVE-WORKING, RADIATION-SENSITIVE LAYER WHICH COMPRISES ADDITIVES FOR PROMOTING DEVELOPABILITY

(75) Inventors: Michael Dörr, Mainz (DE); Andreas Elsässer, Idstein (DE)

(73) Assignee: Agfa-Gevaert (BE)

(*) Notice: Subject to any disclaimer, the term of this patent is extended or adjusted under 35 U.S.C. 154(b) by 467 days.

(21) Appl. No.: 10/017,804

(22) Filed: Dec. 14, 2001

(65) Prior Publication Data

US 2002/0123001 A1 Sep. 5, 2002

(30) Foreign Application Priority Data

Dec. 23, 2000 (DE) .......................... 100 64 889

(51) Int. Cl.$^7$ .......................... G03F 7/021; G03F 7/031
(52) U.S. Cl. ...................... 430/162; 430/175; 430/176; 430/278.1; 430/281.1; 430/302
(58) Field of Search ................ 430/162, 175, 430/176, 278.1, 281.1, 302

(56) References Cited

U.S. PATENT DOCUMENTS

| | | | |
|---|---|---|---|
| 3,235,384 A | 2/1966 | Neugebauer et al. | 96/33 |
| 3,867,147 A | 2/1975 | Teuscher | 96/33 |
| 4,021,243 A | 5/1977 | Steppan et al. | 96/36.4 |
| 4,629,680 A | 12/1986 | Iwasaki et al. | 430/288 |
| 4,631,245 A | 12/1986 | Pawlowski | 430/175 |
| 4,812,384 A | 3/1989 | Franke et al. | 430/175 |
| 5,049,479 A | 9/1991 | Zertani et al. | 430/271 |
| 5,478,690 A | * 12/1995 | Kanda et al. | 430/175 |
| 5,972,572 A | 10/1999 | Konrad et al. | 430/331 |
| 6,197,472 B1 | 3/2001 | Konrad et al. | 430/157 |
| 6,294,298 B1 | 9/2001 | Denzinger et al. | 430/49 |

FOREIGN PATENT DOCUMENTS

| | | |
|---|---|---|
| DE | 12 14 086 | 4/1966 |
| DE | 261 858 | 11/1988 |
| EP | 152 819 | 8/1985 |
| EP | 35 03 115 | 8/1985 |
| EP | 224 162 | 6/1987 |
| EP | 343 576 | 11/1989 |
| EP | 364 735 | 4/1990 |
| EP | 0 499 447 | 8/1992 |
| EP | 563 990 | 10/1993 |
| EP | 778 497 | 6/1997 |
| EP | 923 001 | 6/1999 |
| EP | 1 031 881 | 8/2000 |
| EP | 1 043 627 | 10/2000 |
| WO | 96/10217 | 4/1996 |
| WO | 98/34158 | 8/1998 |

* cited by examiner

Primary Examiner—John S. Chu
(74) Attorney, Agent, or Firm—Connolly Bove Lodge & Hutz LLP

(57) ABSTRACT

The invention relates to a recording material having a dimensionally stable, two-dimensional support, preferably an aluminium support, and a negative-working, radiation-sensitive layer which comprises a diazonium salt, a polymeric binder and a sulphobetaine. In addition, the layer may also comprise a polymerizable monomer or oligomer and a photopolymerization initiator. The front of the recording material may be matted or pigmented, and the back may be coated with an organic polymeric material. The sulphobetaine improves the solubility of the diazonium salts in aqueous-alkaline developers without reducing the resistance of the offset printing plates produced from the recording material.

19 Claims, No Drawings

RECORDING MATERIAL HAVING A NEGATIVE-WORKING, RADIATION-SENSITIVE LAYER WHICH COMPRISES ADDITIVES FOR PROMOTING DEVELOPABILITY

FIELD OF THE INVENTION

The present invention relates to a recording material having a dimensionally stable, two-dimensional support and a negative-working, radiation-sensitive layer which comprises a diazonium salt and an organic polymeric binder. It is intended, in particular, for the production of offset printing plates.

BACKGROUND OF THE INVENTION

Recording materials of the said type are known. As light-sensitive component, their radiation-sensitive layer preferably comprises diazonium salts. These are usually products of the condensation of aromatic diazonium salts (for example diphenylamine-4-diazonium salts) and a carbonyl component (usually formaldehyde).

Refinements of these systems are moving towards increased light sensitivity or an improvement in run stability. The balance between the developability of the recording material after imagewise irradiation (rapid solubility of the components, good developer life) and the resistance of the finished offset printing plate in printing (achievable run size, sensitivity to chemicals, ink take-up) should be preserved here.

Printing plates having good printing properties, in particular having high run stability, are obtained, for example, if the binder in the layer has a high glass transition temperature. Recording materials which can be developed particularly easily and quickly using aqueous-alkaline developers comprise, as binder, polymers based on polyvinylbutyrals which have been modified with carboxyl groups (EP-A 152 819=U.S. Pat. No. 4,631,245), on polyurethanes which have been modified with carboxyl groups (EP-A 563 990) or on polyacrylates which contain corresponding proportions of acrylic or methacrylic acid units (DE-A 35 03 115). The said binders are relatively polar owing to their content of carboxyl groups, which means that the entire layer has polar properties. This in turn frequently results in the printing ink being taken up less well during printing or in an interaction occurring between the printing chemicals and the layer. Both are of course undesired.

Besides binders containing carboxyl groups, those containing sulphonate groups are also known. Ion pairs then form between the sulphonate groups of the binder and the diazonium groups of the light-sensitive component. Recording materials in which use is made of this interaction are described, for example, in WO 96/10217 and WO 98/34158. It is disadvantageous here that two polyelectrolytes of opposite charge have to be brought together, which may under certain circumstances result in complete precipitation.

The light sensitivity can be increased by chemical modification of the diazonium salt. Thus, the type of anions can be varied. Functional groups can be introduced, or other condensable carbonyl compounds can be used for their preparation. Thus, diazonium sulphonates are less soluble in water than diazonium chlorides or bromides and at the same time effect increased light sensitivity of the layer produced therewith (U.S. Pat. No. 3,867,147). Polymeric diazo resins containing relatively large non-polar bridging groups result in layers having increased light sensitivity. The printing plates produced therewith at the same time exhibit good printing properties, in particular good ink take-up, and achieve fairly long print runs. However, there is a negative correlation between the light sensitivity and the developability, i.e. the solubility of the diazo resins in the developer. Diazonium compounds having relatively large anions (organic sulphonates, etc.) or relatively large bridging groups between the individual diazonium groups have increased light sensitivity, but significantly worse solubility in conventional aqueous-alkaline developers. As a consequence, the developer becomes exhausted more quickly and has to be replaced more often.

In order to improve the solubility of the diazonium resins in the developer, anionic, cationic or neutral surfactants have been added to the layer. The surfactants increase the solubility of the layer as a whole, i.e. they improve the so-called basic solubility. However, they also act as plasticizers, meaning that the printing areas in the finished printing plate are less resistant. As a consequence, the achievable print run drops. In addition, the surfactants do not mix with the surrounding matrix to an adequate extent in some cases. They then accumulate at the layer surface, where they impair ink take-up during printing.

The surfactants are generally those which may also be present in developer formulations. Thus, for example, sulphonate surfactants present in the developer may interact with the diazonium salt of the layer and thus promote developability of the layers. However, surfactants in the developer are less effective than those in the layer, since they first have to diffuse into the layer in order to develop their action. A certain time span is necessary for this.

Certain coloured pigment dispersions are likewise suitable for increasing the solubility of the layer. These dispersions generally comprise soluble binders in the developer (EP-A 778 497 and EP-A 1 043 627). By contrast, soluble dyes are not very advantageous owing to their colouring and bleeding behaviour.

OBJECT OF THE INVENTION

It is an object of the present invention to modify radiation-sensitive layers comprising diazonium resins in such a way that they exhibit high light sensitivity and at the same time good developability. In addition, the layers should have good printing properties in the finished printing plates, i.e. the layers should have high resistance to the chemicals used during printing, exhibit good ink take-up and facilitate long print runs.

SUMMARY OF THE INVENTION

It has now been found that the object can be achieved if the layer comprises a sulphobetaine as surfactant.

The present invention accordingly relates to a recording material having a dimensionally stable, two-dimensional support and a negative-working, radiation-sensitive layer which comprises a diazonium salt and a polymeric binder, which is characterized in that the layer comprises a sulphobetaine.

In a particular embodiment, the radiation-sensitive layer in addition comprises a combination of a polymerizable monomer or oligomer and a photopolymerization initiator.

Surprisingly, it has now been found that sulphobetaines generally improve the developability of the layer, irrespective of the type of diazonium resins present therein.

Sulphobetaines are zwitterionic molecules which have an anion and a cation in the same molecule. Zwitterionic structures are known in principle. They occur, for example, in amino acids, but the zwitterionic structure therein exists virtually only at the isoelectric point, i.e. only at a certain pH. Such compounds have little utility in formulations which are intended to serve for the production of printing plates, since slightly acidic coating solutions are usually employed therein. The development of the plate which has been irradiated imagewise is then carried out in the alkaline medium. Thus, if it is desired to utilize the zwitterionic structure of certain molecules, this should exist irrespective of the pH. This is the case in sulphobetaines. They contain an equal number of sulphonate groups and quaternary ammonium groups, which means that the electrical charges compensate for one another internally.

The major advantage of this product class is that the sulphonate group of the component employed is able to form a strong interaction with the diazonium ion, as is also known in light-sensitive diazo resins. At the same time, however, the diazo resin is not converted so strongly into a very low-solubility form, as on use of an organic sulphonate (for example naphthalenesulphonate), but instead a cationic function of the original sulphobetaine is still present and thus still provides good solubility of the radiation-sensitive resin. In this way, particularly high-molecular-weight versions of diazo resins and those with insoluble, non-polar bridging molecules (4,4'-bismethoxymethyldiphenyl ether) can be converted intermediately in the plate formulation into a significantly more soluble version with constant, good light sensitivity. In principle, it is also possible to add the sulphobetaine already as counterion during the preparation of the diazo resins reacted with the organic sulphonates.

Sulphobetaines can be prepared, for example, starting from propane sultone (i.e. the internal ester of 3-hydroxypropanesulphonic acid), which is then reacted with a suitable nucleophile (advantageously a tertiary amine) to give the desired sulphopropylbetaine. In contrast to a synthesis via nucleophilic substitution of chlorine atoms on the starting material, completely salt-free products can be obtained in this way.

In general, the sulphobetaines which are suitable for the purposes of the present invention conform to the following formula I:

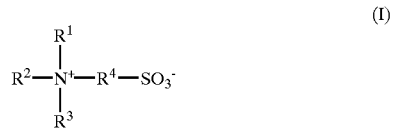

in which
R$^1$ to R$^3$ are identical or different and are substituted or unsubstituted and/or mono- or polyunsaturated, acyclic or isocyclic hydrocarbon radicals having from 1 to 16 carbon atoms, in which one or more methylene groups may be replaced by —O—, —S—, —NH—, —CO—NH— and/or —O—CO—NH— groups, and, in the case of acyclic radicals, in each case two thereof may be linked to one another to form a saturated or unsaturated ring, and R$^4$ is a substituted or unsubstituted (C$_1$–C$_6$) alkanediyl group.

Of the radicals R$^1$ to R$^3$, at least one is preferably a methyl radical. If two of the radicals R$^1$ to R$^3$ are linked to form a ring, then this ring generally contains from 5 to 7 ring members. It is particularly preferably a morpholinium or pyridinium ring. R$^4$ is preferably a substituted or unsubstituted ethane-1,2-diyl, propane-1,3-diyl or butane-1,4-diyl radical.

Any substituents present are, for example, (C$_1$–C$_6$)alkyl groups, (C$_6$–C$_{10}$)aryl groups, hydroxyl groups, mercapto groups and/or halogen atoms (especially fluorine, chlorine or bromine atoms).

The proportion of the sulphobetaines is generally from 1 to 15% by weight, preferably from 2 to 10% by weight, in each case based on the total weight of the non-volatile constituents of the radiation-sensitive layer.

Sulphobetaines are already known. Thus, EP-A 343 576 discloses polymeric binders for magnetic recording materials (i.e., in particular, magnetic tapes) which contain sulphobetaine groups. These are, for example, polyesters, polyurethanes, vinyl chloride copolymers, vinylidene chloride copolymers, acrylic resins, butadiene-acrylonitrile copolymers or styrene-butadiene copolymers, each of which contains covalently bonded sulphobetaine groups. The binders thus acquire greater affinity to the magnetic powder. The latter can then be distributed more finely in the magnetizable layer.

A multilayered photographic recording material having a silver-halide layer and at least one hydrophilic colloid auxiliary layer which comprises a) an anionic surface-active agent, b) at least one further surface-active agent, which may be a betaine, an N-oxide or an amide, and c) dispersed droplets of a water-immiscible, high-boiling solvent, a polyvinyl latex and/or a deionized gelatine. The betaine is, for example, 2-dimethylstearylammonium ethanesulphonate.

The radiation-sensitive layer may be coloured using known dyes and/or pigments, where the absorption band of dye or pigment should overlap as little as possible with the absorption band of the diazo resin. The coloured pigment can be introduced as a paste in a binder (the renol blue used in the following examples is a paste of this type) or in the form of an especially prepared dispersion. Soluble dyes have the advantage that they are soluble in the coating solvent, and frequently also in the developer.

The radiation-sensitive component in the negative-working radiation-sensitive layer is a diazonium salt or a combination of a diazonium salt with a polymerizable monomer or oligomer and a photopolymerization initiator. Polymeric binders which can be used are those which are generally conventional in mixtures of this type.

The light-sensitive diazonium salt is preferably a product of the condensation of an aromatic diazonium salt. Condensation products of this type are known, inter alia, from DE-A 12 14 086 (=U.S. Pat. No. 3,235,384). They are generally prepared by condensation of a polycyclic aromatic diazonium compound, preferably of substituted or unsubstituted diphenylamine-4-diazonium salts, with active carbonyl compounds, preferably formaldehyde, in strongly acidic medium, preferably concentrated phosphoric acid.

U.S. Pat. Nos. 3,867,147 and 4,021,243 describes condensation products which additionally contain units formed by condensation which are free from diazonium salt groups and are preferably derived from aromatic amines, phenols, phenol ethers, aromatic thioethers, aromatic hydrocarbons, aromatic heterocyclic compounds or organic acid amides.

The diazonium salt polycondensation product thus preferably contains recurring R—N$_2$X units which are linked to one another by link units which are derived from condensable carbonyl compounds, in particular formaldehyde, where R is an aromatic radical containing at least two benzene rings, and X is an anion. The diazonium salt polycondensation product may also consist of recurring A—N$_2$X and B units which are linked to one another by link units, preferably methylene groups, which are derived from condensable carbonyl compounds, where A is the radical of an aromatic diazonium compound which is condensable with formaldehyde, and B is the radical of a diazonium group-free compound which is condensable with formaldehyde, in particular an aromatic amine, a phenol, phenol ether, an aromatic thioether, an aromatic hydrocarbon, an aromatic heterocyclic compound or an organic acid amide. In addition, it may be a product containing recurring A—N$_2$X and B units which are linked by divalent link units derived from a condensable carbonyl compound. The diazonium salt units A—N$_2$X are preferably derived from compounds of the formula II:

$$(R^1—R^2—)_p R^3—N_2X \quad (II)$$

where
p is an integer from 1 to 3,
R$^1$ is an aromatic radical having at least one position which is capable of condensation with an active carbonyl compound,
R$^2$ is a single bond or one of the following groups:
—(CH$_2$)$_q$—NR$^4$—, —O—(CH$_2$)$_r$—NR$^4$—, —S—(CH$_2$)$_r$—NR$^4$—, —S—CH$_2$—CO—NR$^4$—, —O—R$^5$—O—, —O—, —S— or —CO—NR$^4$—
in which
q is a number from 0 to 5,
r is a number from 2 to 5,
R$^4$ is hydrogen, an alkyl group having from 1 to 5 carbon atoms, an aralkyl group having from 7 to 12 carbon atoms or an aryl group having from 6 to 12 carbon atoms, and
R$^5$ is an arylene group having from 6 to 12 carbon atoms, and
R$^3$ is a substituted or unsubstituted (p+1)-valent benzene radical, and
X is an anion.

The (p+1)-valent benzene radical is preferably substituted by (C$_1$–C$_4$)alkoxy or (C$_1$–C$_6$)alkyl groups p is preferably 1, which means that R$^3$ is preferably a substituted or unsubstituted phenylene group.

The anion X is preferably chloride, sulphate, phosphate, a substituted or unsubstituted alkanesulphonate having from 1 to 4 carbon atoms, for example methanesulphonate, para-toluenesulphonate, mesitylenesulphonate or an aminoalkanesulphonate, as described in EP-A 224 162. If the (C$_1$–C$_4$)alkanesulphonate is substituted, the substituents are preferably amino or alkoxy groups.

Preference is given to condensation products which are derived from substituted or unsubstituted diphenylamine-4-diazonium salts, in particular from 3-methoxy-diphenylamine-4-diazonium salts, and of these the readily accessible condensation products with formaldehyde. Any substituents present are preferably (C$_1$–C$_4$)alkoxy or (C$_1$–C$_6$)alkyl groups. The condensation can be carried out, in particular, in concentrated sulphuric, phosphoric or methanesulphonate acid, in particular in phosphoric acid. In the latter case, the condensation product can be employed as the crude condensate, i.e. the approximately 50% strength by weight solution in the phosphoric acid that is formed in the condensation can be used directly. This has the advantage that the phosphoric acid which is preferred for stabilization of the condensation product in the mixture is already present. Also suitable for stabilization are sulphuric acid, methanesulphonic acid, para-toluenesulphonic acid or citric acid. An excess of acid is frequently advantageous, and consequently more phosphoric acid can be added in addition to that present in the crude condensate.

Suitable binders are, in particular, polymers containing vinyl alcohol units. Polyvinyl alcohols and polyvinyl acetals which still contain free hydroxyl groups are particularly preferred. Also suitable, however, are other hydroxyl-containing polymers, such as epoxy resins or homopolymers or copolymers containing hydroxyalkyl (meth)acrylate units. In order to make the binders usable for the purposes of the present invention, they are rendered alkali-soluble by reaction with an intramolecular di- or polycarboxylic anhydride. Suitable in principle are both aliphatic or cycloaliphatic and aromatic or heteroaromatic intramolecular di- or polycarboxylic anhydrides. Of the (cyclo)aliphatic di- or polycarboxylic anhydrides, mention should be made of maleic anhydride, dimethylmaleic anhydride, citraconic anhydride, succinic anhydride, glutaric anhydride, cyclohexene-1,2-dicarboxylic anhydride or camphoric anhydride. Particularly preferred aromatic anhydrides are phthalic anhydride and trimellitic anhydride. Also suitable, however, are naphthalene-2,3-dicarboxylic anhydride and -1,8-dicarboxylic anhydride and heteroaromatic acid anhydrides, such as furan- and thiophene-2,5-dicarboxylic anhydride. Reaction products with aromatic carboxylic anhydrides give printing plates having better durability, which enables longer print runs to be achieved. For these reasons, aromatic and heteroaromatic carboxylic anhydrides are preferred over aliphatic or cycloaliphatic carboxylic anhydrides. Through the reaction with carboxylic anhydride, the polymeric binder generally has an acid number of from 20 to 200, preferably from 50 to 150, particularly preferably from 55 to 120. Its mean molecular weight M$_w$ is generally from 10,000 to 300,000, preferably from 20,000 to 200,000. It has proven particularly favourable to carry out the reaction of the hydroxyl-containing polymeric binder with the aromatic di- or polycarboxylic anhydrides in the presence of an organic or inorganic base, such as triethylamine or sodium carbonate.

Furthermore, the binders described above can be mixed with other carboxyl-functionalized polymers in a proportion of up to 50% by weight, based on the total weight of all binders (P), preferably 40% by weight, and introduced into the light-sensitive layer. This has the particular advantage of enabling many commercially and inexpensively available acid group-containing polymers to be employed. Possible additives which may be mentioned in particular here are the following: copolymers of acrylic acid, methacrylic acid, itaconic acid, crotonic acid, fumaric acid, maleic acid, maleic anhydrides (these after subsequent partial saponification to give the corresponding monoesters), polyurethanes, polyesters or polyethers containing carboxyl groups, so that the requirements regarding molecular weight and acid number are satisfied in the same limits as in the case of the polyol-based polymers described above.

The polymerizable monomer or oligomer only optionally present is generally an ethylenically unsaturated compound, preferably an ester or amide of acrylic, methacrylic, fumaric or maleic acid. Of these, preference is in turn given to the compounds containing more than one polymerizable double bond. These include, for example, the esters of the said acids with alkanediols, poly- or oligoethylene glycols, poly- or oligopropylene glycols, poly- or oligobutylene glycols and other bifunctional low- or high-molecular-weight organic diols. Particularly suitable are the esters of polyhydric alcohols, such as glycerol, trimethylolethane or -propane, pentaerythritol, isocyanuric acid, ethoxylated or propoxylated derivatives thereof, and dimers or oligomers of these compounds. The highest possible degree of esterification is advantageous here. It is likewise possible to use amides, for example the compounds which are formally formed in the reaction of ethylenediamine or oligomers thereof with the acids described. The proportion of polymerizable monomers and/or oligomers is from about 5 to 80% by weight, preferably from about 10 to 60% by weight, in each case based on the total weight of the non-volatile constituents of the radiation-sensitive layer.

Use is made as photopolymerization initiators which initiate the polymerization of the polymerizable monomer or oligomer on exposure to actinic radiation, in particular visible or UV light, of different materials depending on the desired sensitization range. If the light-sensitive material is to be sensitive for the near UV range (from 350 to 420 nm) which is usual in offset printing, different photoinitiator systems are used than if the exposure is to be carried out in the visible spectral region, for example with laser radiation.

The photoinitiators to be exposed in the near UV region should absorb light in the range between about 250 and 500 nm with formation of free radicals. Examples are acyloins and derivatives thereof, such as benzoin, benzoin alkyl ethers, vicinal diketones and derivatives thereof, for example benzil, benzil acetals, such as benzil dimethyl ketal, fluorenones, thioxanthones, polycyclic quinones, acridines, and quinoxalines, furthermore trichloromethyl-s-triazines, 2-halomethyl-4-vinyl-1,3,4-oxadiazole derivatives, trichloromethyl-substituted halooxazoles, trihalomethyl-containing carbonylmethyleneheterocyclic compounds and acylphosphine oxide compounds. The photoinitiators can also be used in combination with one another or with coinitiators or activators, for example with Michler's ketone or a derivative thereof or with a 2-alkylanthraquinone. In the case of the photoinitiators employed in particular for radiation in visible range, mixtures of metallocenes, photoreducible dyes, photolytically cleavable compounds containing trihalomethyl groups and, if desired, further initiator and dye constituents are usually suitable, as described in EP-A 364 735. The metallocene component consists of variously substituted cyclopentadienyl complexes of titanium or zirconium. Photoreducible dyes which can be used are xanthene, benzoxanthene, benzothioxanthene, thiazine, pyronine, porphyrin or acridine dyes. In the case of the trihalomethyl coinitiators, the known triazine derivatives with bromine or chlorine as halogen have proven particularly successful. In addition, the initiator comprises, for example, acridine, phenazine or quinoxaline derivatives in order to increase the sensitivity in the near UV region and, for example, dibenzalacetones or coumarines in order to increase the sensitivity in the visible region.

The amount of photoinitiator or initiator combination is generally from about 0.1 to 15% by weight, preferably from about 0.5 to 10% by weight, in each case based on the total weight of the non-volatile constituents of the radiation-sensitive layer.

The photopolymerizable layer may in addition comprise stabilizers for suppressing thermal polymerization, plasticizers or other auxiliaries for improving the mechanical or reprographic quality. It should always be ensured here that the admixed substances do not absorb an excessive proportion of the actinic light necessary for the polymerization and thereby lower the practical light sensitivity.

In order to shorten evacuation times in vacuum contact copy frames, the recording material according to the invention is, in a preferred embodiment, pigmented or matted on the image side.

The pigmentation particles may be located in the light-sensitive layer or any top layer located thereabove. The material with which the pigmentation is achieved is generally of an inorganic nature and is virtually insoluble in water. The mean particle size of the pigmentation particles is generally from 0.1 to 20.0 $\mu$m, preferably from 1.0 to 15.0 $\mu$m, particularly preferably from 3 to 5 $\mu$m. The proportion of pigmentation agent is selected in such a way that the surface of the recording material has a Bekk smoothness of <1000 seconds, preferably from 20 to 250 seconds (determined in accordance with DIN 53 107, method A).

Preferred pigmentation agents are silicic acid products having a mean particle size of from 3 to 5 $\mu$m and an exclusion limit of 15 $\mu$m. In a preferred embodiment, the silicic acid products are combined with a surfactant, in particular a surfactant containing siloxane units. The proportion of the surfactant is generally from 0.01 to 2% by weight, based on the dry weight of the radiation-sensitive layer. Preference is furthermore given to silicic acid products which have been hydrophobicized (in particular with wax) or chemically modified (in particular with silanes).

The term silicic acid products here is taken to mean synthetic silicic acids and silicates in accordance with DIN 55 921. Accordingly, both pure $SiO_2$ and metal oxide-containing silicic acids (for example aluminium silicates) can be used, even though a precise distinction between the two is not possible. The term "silicic acid product" therefore approximates to the customary term "silica", which does not or does not always distinguish between silicic acid and silicates. Silicic acid products which can be employed are, for example, ®Syloid grades from Grace, ®Silcron from Lanco, ®Gasil from Crosfield, OK/HK grades from Degussa and ®Satintone from Engelhard-Chemie.

The term "mean particle size" is taken to mean the 50% value of the cumulative weight or volume distribution curve, as defined in the corresponding DIN standard 66 141. The exclusion limit denotes the 100% value. This standard describes the basic principles for the preparation of particle size distributions. They apply to all particular substances, irrespective of the nature of the fineness feature measured. Various methods are available for determination of the characteristic values, such as sedimentation measurements, image-analysis evaluation of electron photomicrographs, conductivity measurements, light scattering, etc.

The amount of silicic acid product necessary in order to achieve a Bekk smoothness of less than 1000 seconds, preferably from 20 to 250 seconds, varies greatly. It is dependent on the mean particle size of the matting particles, and also on the layer weight of the radiation-sensitive layer or the top layer and on the roughness of the support surface.

As already described, the silicic acid fillers may be present in the light-sensitive layer or in a top layer located thereon. It is also possible for an unpigmented, transparent top layer to be located on a pigmented, radiation-sensitive layer. However, this top layer must not be too thick, i.e. the mean particle size of the matting particles must be greater than the total thickness of light-sensitive layer and top layer together.

Instead of the pigmentation, it is also possible for a discontinuous matting layer to be present. It is produced by generally known processes, in particular by spraying-on a corresponding solution, for example with the aid of a spray bell operating at very high rotational speeds. The solution generally comprises (at least) an organic polymeric resin which, after drying, forms elevations on the surface of the recording material.

In order to make the mixture flowable so that it can be applied to a support material, an organic solvent is advantageously added. In general, for example, alcohols, ketones, esters or ethers are suitable. Particularly favourable are (partial) ethers or ether-esters of alkylene glycols (in particular ethylene glycol and propylene glycol), dialkylene glycols or polyalkylene glycols. Mention may be made, for example, of diethylene glycol mono($C_1$–$C_6$)alkyl ethers, especially diethylene glycol monomethyl ether, monoethyl ether or monobutyl ether. In order to achieve good layer flow and a uniform layer surface, the coating solvent preferably comprises low-boiling organic solvents (boiling point at atmospheric pressure below 150° C., preferably from 50 to 120° C.; examples: tetrahydrofuran, ethylene glycol monomethyl ether) and high-boiling organic solvents (boiling point at atmospheric pressure above 180° C.; examples: diethylene glycol mono ($C_1$–$C_6$)alkyl ethers)

Suitable supports are plates, films, foils or tapes made from metal, plastic or plastic/metal laminates, for example from aluminium/polyester laminates. However, preference is given to metallic supports, in particular those made from aluminium or an aluminium alloy. The aluminium supports are usually mechanically, chemically and/or electrochemically roughened, if necessary also anodically oxidized and/or chemically aftertreated. Suitable for the aftertreatment are, for example, polymers or polycondensates with phosphonic acid, carboxylic acid or sulphonic acid groups, which may also contain units with basic groups (in particular amino groups), furthermore silicates, phosphates, fluorides or fluoro complexes. It is also possible for a plurality of the said treatment steps to be combined.

In addition, the support may be provided with a back coating of an organic polymeric material (cf. EP-A 1 031 881). The polymeric material generally has a glass transition temperature of 45° C. or above. The back coating is generally applied continuously. It prevents the support, inter alia, from being attacked by the aqueous-alkaline developer, which is of particular importance in the case of aluminium supports.

The radiation-sensitive mixture may also be applied to the support by spin coating, casting, or by other generally conventional and known methods. The coating is subsequently dried, for example in a fan-assisted oven. The weight of the dried radiation-sensitive layer is generally from 0.3 to 3.0 g/m², preferably from 0.5 to 2.0 g/m², particularly preferably from 0.6 to 1.6 g/m².

The radiation-sensitive recording material is then irradiated imagewise. Depending on the nature of the light-sensitive component, UV, visible or IR radiation can be used. In general, the radiation is carried out through a film mask. To this end, the mask is laid directly onto the radiation-sensitive layer in a vacuum contact copy frame. Before the irradiation, air remaining between the film mask and the recording material is then pumped away.

After the imagewise irradiation, the recording material is then developed using an aqueous-alkaline solution which suits negative recording materials. Such solutions are known and are described, for example, in EP-A 923 001. A particularly suitable developer comprises at least one compound which is alkaline in water, at least one emulsifier, at least one water-miscible organic solvent and at least one surfactant. The alkaline compound is preferably an alkanolamine (in particular ethanolamine, di- or triethanolamine, isopropanolamine, diisopropanolamine-amine or trishydroxymethylaminomethane), a hydroxide (in particular an alkali metal or alkaline earth metal hydroxide), a phosphate or a carbonate (in particular sodium, potassium or ammonium carbonate or hydrogencarbonate). The proportion of the alkaline compound is generally from 0.1 to 20% by weight, in particular from 0.5 to 10% by weight, in each case based on the total weight of the ready-to-use developer. Its pH is generally from 8 to 13, preferably from 8.5 to 11.5.

The emulsifier is generally a copolymer containing units of hydrophobic vinyl compounds and hydrophilic, ethylenically unsaturated carboxylic acids, where some of the carboxyl groups of the copolymer are also esterified. The proportion of emulsifiers is generally from 0.1 to 10% by weight, preferably from 0.2 to 8.0% by weight.

The term "water-miscible" in this connection is taken to mean organic solvents which, in the amount used (up to about 20% by weight) at a temperature at which developers are normally stored or used (from about 0 to 60° C.), form a uniform solution with water. Particularly suitable organic solvents are alcohol, such as benzyl alcohol, ethylene glycol monophenyl ether, 1- or 2-phenylethanol, glycerol or glycerol acetates. The proportion of these solvents is generally from 0.5 to 15.0% by weight, preferably from 1.0 to 10.0% by weight, particularly preferably from 2.0 to 6.0% by weight, in each case based on the total weight of the ready-to-use developer.

Of the surfactants, the anionic surfactants are particularly suitable. In addition, it is also possible, with success, to employ mixtures of anionic and nonionic or zwitterionic surfactants. In particular, anionic surfactants, such as alkali metal octyl sulphates, dodecylbenzenesulphonates, alkylphenol ether sulphates, naphthalenesulphonates, sulphosuccinates and alkyl ether phosphates have proven successful. Nonionic surfactants originate, for example, from the substance classes of the ($C_{10}$–$C_{18}$) fatty alcohol ethoxylates, the polyethylene glycols, ethylene oxide-propylene oxide (block) copolymers and alkylphenol ethoxylates. The proportion of surfactants is generally from 0.2 to 12.0% by weight, preferably from 0.5 to 8.0% by weight, particularly preferably from 1.0 to 6.0% by weight, based on the total weight of the developer.

After the development, the areas which later accept the printing ink stand out clearly visibly and in high contrast from the support material. The difference in optical density, determined by reflection densitometry using a cyan filter, between the (uncovered) support and the layer areas is generally at least 0.8. The colour pigmentation neither impairs the development process nor reduces the print run. Owing to the high contrast, the printing plate obtained in this way can, if necessary, be corrected particularly easily. Of even greater importance is that the proportion of the printing areas of the plate can be determined particularly reliably by a scanner. The recording material according to the invention can be used to produce printing plates which are readily able to achieve runs of from 250,000 to 300,000 prints.

The following working examples are intended to illustrate the invention. "pbw" therein stands for part(s) by weight. Percentages are per cent by weight, unless stated otherwise. Comparative examples and comparative substances are denoted by an asterisk (*).

EXAMPLES

The diazonium salt used in the examples was in each case a diazonium salt polycondensation product prepared from equimolar amounts of 3-methoxydiphenylamine-4-diazonium sulphate and 4,4'-bismethoxymethyldiphenyl ether in 85% strength phosphoric acid, isolated as the mesitylenesulphonate.

In addition, the following polymeric materials were used:

P1: A polyvinylbutyal having a mean molecular weight $M_w$ of about 80,000 which comprised 71 mol % of vinylbutyral units, 27 mol % of vinyl alcohol units and 2 mol % of vinyl acetate units and was reacted with phthalic anhydride in diethylene glycol monomethyl ether in the presence of anhydrous sodium carbonate; the reaction product which precipitated in water had an acid number of about 70 mg of KOH/g.

P2: A copolymer consisting of vinylpyrrolidone (19%), t-butyl acrylate (73%) and acrylic acid (8%) having a mean molecular weight Mn of 20,000 and a dispersity of 2. The measured acid number of the material was 65.

Colouring

D1: ®Renol Blue BG 2 HW (Clariant) Copper phthalocyanine/polyvinylbutyral grinding
D2: Pigment dispersion (13.7%) consisting of 6.85 ppw of Heliogen Blue D7490 (copper-free phthalocyanine pigment from BASF AG) and 6.85 pbw of P1 (see above) in 86.3 pbw of methyl ethyl ketone, ground in a ball mill so that no particles having a diameter of greater than 3 µm were visible in a transmitted-light microscope
D3: Victoria Pure Blue (Colour Index No. 44045)

Monomers and Initiator

M1: Hexa-functional aromatic urethane acrylate (®Ebecryl 220 from UCB Radcure)
I: 2-Benzo-1,3-dioxol-5-yl-4,6-bistrichloromethyl-1,3,5-triazine Sulphobetaines SB1 1-(3-Sulphopropyl)pyridinium betaine (PPS from Raschig AG)
SB2 N,N-dimethyl-N-(3-sulphopropyl)-N-tetradecylammonium betaine (®Ralufon DM from Raschig AG)
SB3 N-(3-dodecanoylaminopropyl)-N-(2-hydroxy-3-sulphopropyl)-N,N-dimethylammonium betaine (®Ralufon CAS-OH from Raschig AG)

Surfactant for Comparative Example

T1 Octaethyleneglycol monooctyl ether(®Ralofon EN 16-80 from Raschig AG)

TABLE 1

| Example | Colouring | Binder | Diazonium resin | Sulphobetaine | Phosphoric acid | PADA | Monomer |
|---|---|---|---|---|---|---|---|
| 1* | D1 0.45 | P1 2.31 | 1.54 | — | 0.15 | 0.05 | — |
| 2* | D1 0.45 | P1 2.23 | 1.49 | T1 0.14 | 0.15 | 0.05 | — |
| 3 | D1 0.45 | P1 2.23 | 1.49 | SB3 0.14 | 0.15 | 0.05 | — |
| 4 | D1 0.45 | P1 2.15 | 1.44 | SB3 0.28 | 0.14 | 0.05 | — |
| 5 | D1 0.45 | P1 2.05 | 1.37 | SB3 0.45 | 0.14 | 0.05 | — |
| 6 | D1 0.45 | P1 2.05 | 1.37 | SB2 0.45 | 0.14 | 0.05 | — |
| 7 | D1 0.45 | P1 2.05 | 1.37 | SB1 0.45 | 0.14 | 0.05 | — |
| 8* | D2 4.92 | P1 2.04 | 1.58 | — | 0.16 | 0.05 | — |
| 9 | D2 4.92 | P1 1.87 | 1.47 | SB3 0.29 | 0.15 | 0.05 | — |
| 10* | D3 0.18 | P1 2.47 | 1.64 | — | 0.16 | 0.05 | — |
| 11 | D3 0.18 | P1 2.30 | 1.53 | SB3 0.29 | 0.15 | 0.05 | — |
| 12 | D1 0.41 | P1/P2 1.13/1.13 | 1.51 | SB3 0.14 | 0.15 | 0.05 | — |
| 13 | D1 0.41 | P2 2.26 | 1.51 | SB3 0.14 | 0.15 | 0.05 | — |
| 14* | D1 0.41 | P1/P2 1.15/1.15 | 0.77 | — | 0.08 | 0.05 | M1 0.77 |
| 15 | D1 0.41 | P1/P2 1.13/1.13 | 0.75 | SB1 0.09 | 0.08 | 0.05 | M1 0.75 |
| 16 | D1 0.41 | P1/P2 1.10/1.10 | 1.03 | SB1 0.20 | 0.10 | 0.05 | M1 0.44 |

The data relate to parts by weight per 100. The difference of the constituents from 100 is made up by a solvent mixture comprising diethylene glycol monomethyl ether and ethanol (1:1).

PADA=4-phenylazodiphenylamine (=4-anilinoazobenzene)

The negative-working mixtures shown in Table 1 were then each spin-coated onto an aluminium foil with a thickness of 300 µm, the foil having previously been roughened in dilute nitric acid ($R_z$ value in accordance with DIN 4768: 6.0 µm), subjected to intermediate pickling in dilute sulphuric acid, anodized (oxide weight 2.0 g/m$^2$) and hydrophilized using polyvinylphosphonic acid. After drying (at a/100° C. for 2 min), the negative-working layer had a weight of 1.0 g/m$^2$.

The recording materials produced in this way were then irradiated imagewise with UV light under a film mask in a vacuum contact copy frame (irradiation energy about 400 mJ/cm$^2$). They were subsequently developed using a commercially available aqueous-alkaline developer for negative printing plates (Agfa EN 232). Table 2 below shows the characteristics of the individual plates:

TABLE 2

| Example | ΔE | Light sensitivity | Print run | Ink take-up |
|---|---|---|---|---|
| 1 | 4.5 | 6.0 | 100 | 7 |
| 2 | 1.3 | 4.5 | 70 | 14 |
| 3 | 1.4 | 6.1 | 98 | 7 |
| 4 | 0.9 | 6.1 | 95 | 7 |
| 5 | 0.7 | 6.0 | 97 | 8 |
| 6 | 0.8 | 5.8 | 91 | 7 |
| 7 | 1.0 | 5.7 | 95 | 7 |
| 8 | 3.4 | 5.7 | 105 | 7 |
| 9 | 0.4 | 5.5 | 102 | 7 |
| 10 | 2.2 | 4.7 | 110 | 7 |
| 11 | 0.3 | 4.8 | 107 | 8 |
| 12 | 0.9 | 5.5 | 99 | 8 |
| 13 | 0.8 | 5.3 | 96 | 8 |
| 14 | 2.9 | 6.6 | 108 | 7 |
| 15 | 1.0 | 6.7 | 104 | 7 |
| 16 | 0.4 | 6.4 | 105 | 7 |

ΔE denotes the difference in the $L_{ab}$ values of unexposed plates developed by dipping and rinsing off with a hand spray and the support developed freely by mechanical assistance (immersion time 5 sec, developer temperature 20° C.)
Light sensitivity as value of the UGRA wedge step at a colour density of 50% of a printing plate measured by densitometry (cyan filter). Exposure energy 400 mJ/cm$^2$
Print run as relative comparison with standard 1 (100%)
Ink take-up by test and measurement of the print sheet to maximum ink saturation

What is claimed is:

1. A recording material which comprises a support and a negative-working, radiation-sensitive layer which comprises a diazonium salt and a polymeric binder, the radiation-sensitive layer comprises a sulphobetaine, wherein the sulphobetaine is of the formula I:

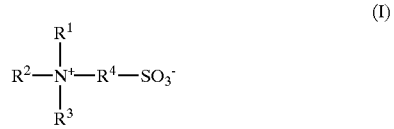

(I)

in which
R$^1$ to R$^3$ are identical or different and are substituted or unsubstituted and/or mono- or polyunsaturated, acyclic or isocyclic hydrocarbon radicals having from 1 to 16 carbon atoms, in which one or more methylene groups is optionally replaced by
—O—, —S—, —NH—, —CO—NH— and/or —O—CO—NH—groups, and, in the case of the acyclic radicals, each two thereof is optionally linked to one another to form a saturated or unsaturated ring, and
R$^4$ is a substituted or unsubstituted (C$_1$–C$_6$)alkanediyl group.

2. The recording material according to claim 1, wherein the radiation-sensitive layer in addition comprises a combination of a polymerizable monomer or oligomer and a photopolymerization initiator.

3. The recording material according to claim 1, wherein at least one of the radicals R$^1$ to R$^3$ is a methyl radical.

4. The recording material according to claim 1, wherein two of the radicals R$^1$ to R$^3$ are linked to one another with formation of a five- to seven-membered ring.

5. The recording material according to claim 1, wherein the radical R$^4$ is a substituted or unsubstituted ethane-1,2-diyl, propane-1,3-diyl or butane-1,4-diyl radical.

6. The recording material according to claim 1, wherein the proportion of the sulphobetaines is from 1 to 15% by weight, based on the total weight of the non-volatile constituents of the radiation-sensitive layer.

7. The recording material according to claim 1, wherein the radiation-sensitive layer has been coloured using dyes and/or pigments.

8. The recording material according to claim 1, wherein the diazonium salt is a condensation product of an aromatic diazonium salt.

9. The recording material according to claim 1, wherein the weight of the radiation-sensitive layer when dried is from 0.3 to 3.0 g/m$^2$.

10. The recording material according to claim 1, wherein the material is pigmented or matted.

11. The recording material according to claim 1, wherein the support is a plate, a film, a foil or a band of metal, plastic or a plastic/metal laminate.

12. The recording material according to claim 11, wherein the support is an aluminium or an aluminium alloy, and at least one side of the support has been mechanically, chemically and/or electrochemically roughened, and optionally anodically oxidized and/or chemically aftertreated.

13. The recording material according to claim 1, wherein the support has been provided with a back coating of polymeric materials.

14. A process for the production of a printing plate for offset printing, which comprises exposing imagewise the recording material according to claim 1, and subsequently developing using an aqueous-alkaline developer.

15. The recording material according to claim 4, wherein two of the radicals R$^1$ to R$^4$ are linked to one another to form a morpholinium ring or a pyridinium ring.

16. The recording material according to claim 5, wherein the proportion of the sulphobetaine is from 2 to 10% by weight based on the total weight of the non-volatile constituents of the radiation-sensitive layer.

17. The recording material according to claim 16, wherein the weight of the radiation-sensitive layer when dried is from 0.5 to 2.0 g/m$^2$.

18. The recording material according to claim 16, wherein the weight of the radiation-sensitive layer when dried is from 0.6 to 1.6 g/m$^2$.

19. A recording material which comprises support and a negative-working, radiation-sensitive layer which comprises a diazonium salt and a polymeric binder, the radiation-sensitive layer comprises a sulphobetaine as surfactant.

* * * * *

UNITED STATES PATENT AND TRADEMARK OFFICE
CERTIFICATE OF CORRECTION

PATENT NO. : 6,911,291 B2
DATED : June 28, 2005
INVENTOR(S) : Michael Dorr et al.

It is certified that error appears in the above-identified patent and that said Letters Patent is hereby corrected as shown below:

Column 13,
Line 24, insert a space after "$(C_1-C_6)$".

Signed and Sealed this

Eighth Day of November, 2005

JON W. DUDAS
*Director of the United States Patent and Trademark Office*